United States Patent [19]
Pope

[11] Patent Number: 6,163,228
[45] Date of Patent: Dec. 19, 2000

[54] OSCILLATOR WITH POWER CONSERVATION MODE

[75] Inventor: Matthew D. Pope, Aurora, Colo.

[73] Assignee: Vari-L Company, Inc., Denver, Colo.

[21] Appl. No.: 09/354,003

[22] Filed: Jul. 15, 1999

Related U.S. Application Data

[60] Provisional application No. 60/093,460, Jul. 20, 1998.

[51] Int. Cl.[7] .................................. H03B 5/12; H03L 5/00
[52] U.S. Cl. .................................. 331/117 R; 331/117 FE; 331/167; 331/185
[58] Field of Search .................................. 331/117 R, 117 FE, 331/167, 168, 185, 186

[56] References Cited

U.S. PATENT DOCUMENTS 4,621,241  11/1986  Kiser .
5,155,453  10/1992  Ruetz .................................. 331/116 FE

*Primary Examiner*—Siegfried H. Grimm
*Attorney, Agent, or Firm*—Ancel W. Lewis, Jr.

[57] ABSTRACT

An oscillator having a tank circuit, an amplifier circuit and a switching circuit. The switching circuit switches the oscillator between a normal power consumption mode and a lower power consumption mode. The amplifier circuit includes an emitter biased transistor. The switching circuit switches between power consumption modes by switching between two selected voltages at the base of the transistor. When in the lower power consumption mode, the oscillator has sufficient current to sustain oscillation but insufficient current to meet the phase noise requirements for good fidelity and high data rates. When in the normal power consumption mode, the oscillator has sufficient current to meet the phase noise requirements for good

10 Claims, 1 Drawing Sheet

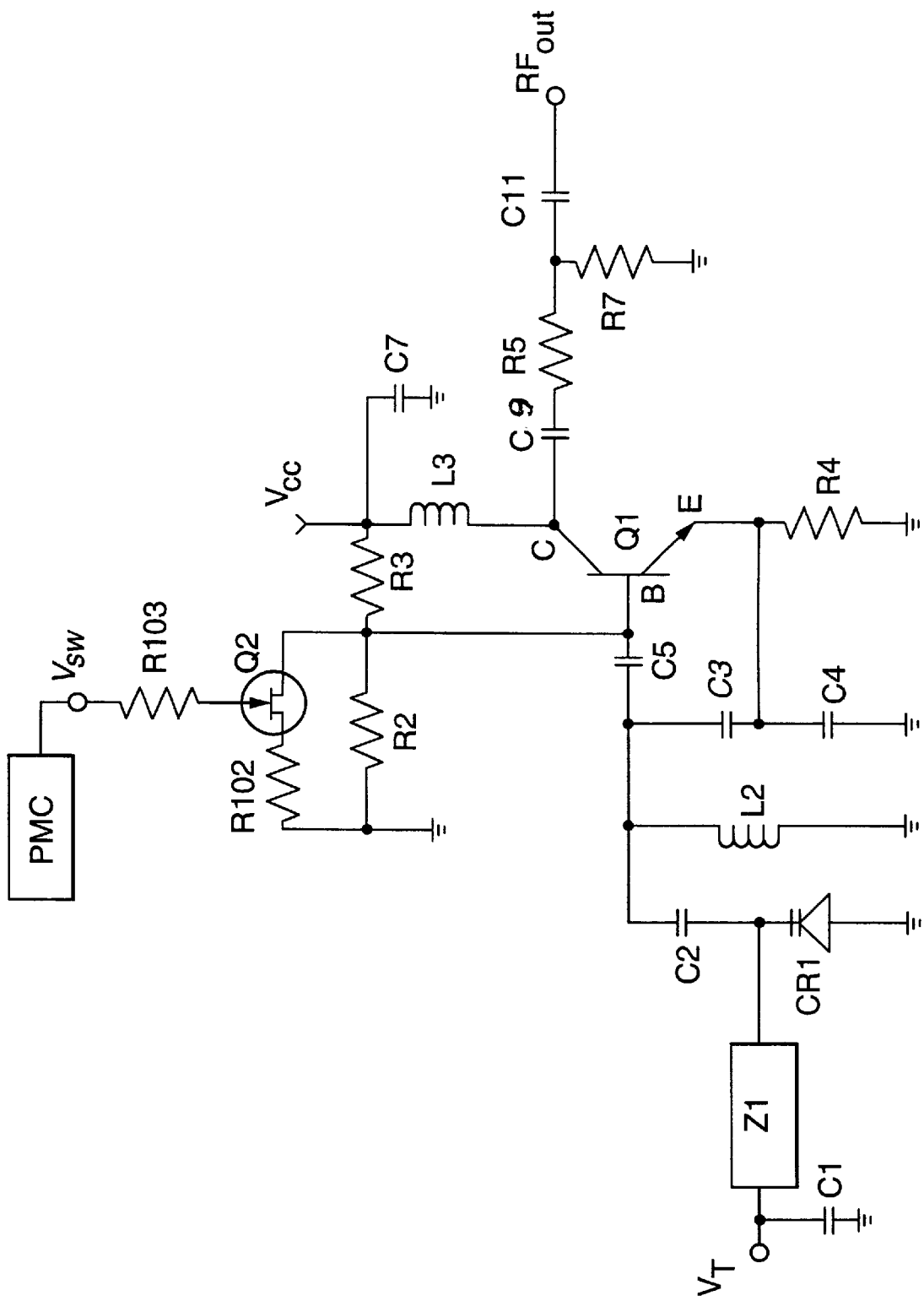

OSCILLATOR WITH POWER CONSERVATION MODE

This application claims the benefit under 35 U.S.C. §119(e) of the U.S. provisional patent application No. 60/093,460 filed Jul. 20, 1998.

TECHNICAL FIELD

This invention relates to electronic oscillators and more particularly to an electronic oscillator switchable between a normal power consumption mode and a lower power consumption mode.

BACKGROUND ART

There are a great variety of wireless communication systems being used in the world today, such as Global System for Mobile Communication (GSM), Digital Advanced Mobile Phone Service (DAMPS), Personal Handy System (PHS), Personal Communication Services (PCS), Land Mobile Radio (LMR), Special Mobile Radio (SMR) and two way paging to name a few. The consumer would like their phone or pager to reliably work anywhere in the world for a long time. One of the keys to the amount of time that a phone can go without being recharged is the amount of current the oscillator draws when the phone is in receive mode.

Typically, the Voltage Controlled Oscillator (VCO) generates the Local Oscillator (LO) signal for transmit and receive functions in mobile radio RF circuitry. The VCO is typically left on in the standby mode when the phone is neither transmitting or receiving.

The prior known methods to conserve current in VCO designs or implementation in a phone have consisted of putting a phase shift network in the feedback circuitry or switching the transmit VCO off along with the power transmitter to conserve dc power. U.S. Pat. No. 4,621,241 to Kiser discloses a VCO with a phase shift network in the feedback circuitry.

The disadvantage of using a phase shift network in the feedback network is the current consumption is fixed and the oscillator current and performance must be optimized to meet the performance requirements when operating in the normal power consumption mode.

The oscillator is typically used in a phase locked loop (PLL). The disadvantage of turning the transmitter oscillator off with the power transmitter is that the PLL takes time to lock after the oscillator is turned back on, meaning lost transmit time and channel inefficiency.

A known power level is needed in the oscillator to meet the phase noise requirements for good fidelity and high data rates when the phone is transmitting and receiving. This is the normal power consumption mode. Oscillation will be sustained in the oscillator and the PLL will remain locked at a lower power level when the phone is not transmitting or receiving. The phase noise is, however, degraded in this lower power consumption mode. An oscillator is needed with switching means to switch between the normal and lower power consumption modes in order to conserve power without loss of transmit time or loss of channel efficiency.

DISCLOSURE OF THE INVENTION

An electronic oscillator having a DC power consumption switching circuit for switching the oscillator between a normal power consumption mode and a lower power consumption mode is disclosed. The oscillator includes a tank circuit and a signal amplifier circuit. The current flow through the signal amplifier circuit is controlled by the voltage at the control terminal of an amplifying element in the signal amplifying circuit. The circuitry that switches the oscillator to a lower DC power includes a switching element and resistive elements which change the voltage at the control terminal of the amplifying element. The voltage change decreases the current through the amplifying element and thereby decreases the power consumption of the oscillator while sustaining oscillation. The oscillator, while in the lower power consumption mode, consumes approximately half the power consumed in the normal power consumption mode and is able to provide enough feedback power to a PLL to keep the PLL locked. The oscillator extends the battery life of a phone without degrading transmit time or channel efficiency.

BRIEF DESCRIPTION OF THE DRAWINGS

Details of this invention are described in connection with the accompanying drawing:

The drawing is an electric circuit diagram of a voltage controlled oscillator with a power consumption switching circuit embodying features of the present invention.

DETAILED DESCRIPTION OF THE INVENTION

Referring to the drawing, there is shown a voltage controlled oscillator embodying features of this invention which includes a tank circuit, a signal amplifier circuit and a switching circuit.

Describing the specific embodiments herein chosen for illustrating the invention, certain terminology is used which will be recognized as being employed for convenience and having no limiting significance. Terminology consistent with conventional current flow, not electron flow, will be used. The terms "input" and "output" will refer to conventional current flow into and out of the device. Further, all of the terminology above-defined includes derivatives of the word specifically mentioned and words of similar import.

The tank circuit shown is a parallel tuned resonant circuit in a Colpitts type configuration. Other types of tank circuit, such as Pierce or Hartley or a series tuned Colpitts, would be suitable for use in the invention. The tank circuit includes a resonating inductor L2 connected in parallel with a DC blocking capacitor C2 that is connected in series with a tuning capacitor CR1, shown as a varactor diode. The resonating inductor L2 is connected to ground on the side opposite the connection to DC blocking capacitor C2. The tuning capacitor CR1 is connected to ground on the side opposite the connection to DC blocking capacitor C2. The tank circuit includes a first signal divider capacitor C3 connected to the connection of the first resonating inductor L2 and the DC blocking capacitor C2 on one side, and connected to a second signal divider capacitor C4 on an opposite side. The side of second signal divider capacitor C4 opposite the connection to the first signal divider capacitor C3 is connected to ground.

A DC voltage tuning input terminal $V_T$ is connected through an impedance Z1 to the connection of the tuning capacitor CR1 and the DC blocking capacitor C2. A voltage, typically from 0 to 8 volts, is applied to terminal $V_T$ to tune the capacitance of the tuning capacitor CR1. The impedance Z1 is of a high value so as not to load the Q of the tank circuit, and may be an RF choke, a high impedance active device such as a transistor, or another network presenting a high RF impedance and a controlled DC resistance. An RF bypass capacitor C1 is connected to input terminal $V_T$ and to ground to provide a low pass filter and thereby short out any RF signals.

The signal amplifier circuit for the voltage controlled oscillator includes an amplifying element, shown as an NPN transistor Q1. The transistor Q1 has a collector terminal C as an input for the amplifying element, a base terminal B as control terminal for the amplifying element and an emitter terminal E as an output for the amplifying element. A DC voltage supply terminal $V_{CC}$ connects through an inductive impedance L3 to collector terminal C to supply DC power to transistor Q1. A voltage, typically from 0 to 5 volts, is applied to DC voltage supply terminal $V_{CC}$. An RF bypass capacitor C7 connects between the DC voltage supply terminal $V_{CC}$ and ground to provide an RF ground.

The power output is shown as being taken from the collector terminal C of the transistor Q1. The output coupling and impedance matching can be accomplished in a number of ways to match the active device to the desired output load. In the illustrated embodiment, a capacitor C9, a resistor R5 and a capacitor C11 are connected in series respectively from the collector terminal C to an output terminal $RF_{out}$. A resistor R7 is connected at one side between resistor R5 and capacitor C11, and connected at the other side to ground.

A bias impedance in the form of a resistor R4 is connected between the emitter terminal E of the transistor Q1 and ground. The feedback loop for sustaining the oscillations in the tank circuit includes the transistor Q1, first signal divider capacitor C3, and a capacitor C5. The emitter terminal E connects between the first and second signal divider capacitors C3 and C4. The one side of the capacitor C5 connects to the base terminal B of transistor Q1 and the other side of capacitor C5 connects to the common connection of first signal divider capacitor C3, DC blocking capacitor C2 and resonating inductor L2.

The switching circuit provides a switching means for switching the oscillator between the normal power consumption mode and the lower power consumption mode and includes resistors R2, R3, R102 and R103, and a switching element, shown as a field-effect transistor Q2 in the illustrated embodiment. A bipolar transistor or a diode would also be suitable for use as the switching element in the present invention. Resistor R3 connects on one side to a DC voltage supply, shown in the illustrated embodiment as the DC voltage supply terminal $V_{CC}$. One side of resistor R2 connects to the other side of resistor R3 and the other side of resistor R2 connects to ground. The drain of field-effect transistor Q2 connects to the common connection of resistors R2 and R3. The source of field-effect transistor Q2 connects through resistor R102 to ground. The gate of field-effect transistor Q2 is connected through resistor R103 to a switching voltage terminal $V_{SW}$. Voltage is selectively applied to the switching voltage terminal $V_{SW}$ by a power management controller PMC. The common connection of resistors R2 and R3 and the drain of field-effect transistor Q2 is connected to the base terminal B of transistor Q1. The field-effect transistor and resistors R2 and R102 thereby form a selecting means for selecting the resistance from the base terminal B to ground.

By way of example, and not limitation, the table below lists exemplary values for the components of the above described circuit for a frequency of about 900 MHz.

| | |
|---|---|
| C1 | 47 pF |
| C2 | 4.3 pF |
| C3 | 2.0 pF |
| C4 | 3.9 pF |
| C5 | 1.0 pF |
| C7 | 33 pF |
| C9 | 39 pF |
| C11 | 33 pF |
| CR1 | 19 to 10 pF over 1 to 4 volts |
| L2 | 8 nH |
| R2 | 2 kΩ |
| R3 | 2 kΩ |
| R4 | 91 Ω |
| R5 | 68 Ω |
| R7 | 68 Ω |
| R103 | 10 kΩ |
| R102 | 2 kΩ |
| Vcc | 3 V |
| Vsw | 3 V |
| Vt | 0–5V |

The switching circuit functions by reducing the voltage at the base terminal B when the field-effect transistor Q2 is on, thereby reducing the voltage at the emitter terminal E and thereby reducing the current through the transistor Q1. The voltage $V_B$ at the base terminal B is the potential between the common connection of field-effect transistor Q2, resistor R2 and resistor R3, and ground. When field-effect transistor Q2 is off, the voltage $V_B$ is the potential across resistor R2 which equals $V_{CC} \times R2/(R2+R3)$.

For the above illustrative values, $V_B$ can be calculated to be 3V×2 kΩ/(2 kΩ+2 kΩ)=1.5V. The voltage difference between the base and emitter in a transistor is known to be about 0.7V so the voltage $V_E$ at the emitter terminal is 0.8V. The current $I_C$ through the collector terminal C is approximately the current $I_E$ through the emitter terminal C which is $V_E/R4$, so $I_C=0.8V/91\ \Omega=8.8$ mA. This is the current level for the normal power consumption mode and is sufficient to meet the phase noise requirements for good fidelity and high data rates.

When field-effect transistor Q2 is on, the voltage $V_B$ is the potential across the parallel resistance R2' of resistors R2 and R102. The parallel resistance $R2'=(R2 \times R102)/(R2+R102)$ and $V_B=V_{CC} \times R2'/(R2'+R3)$. For the illustrative values $R2'=(2\ k\Omega \times 2\ k\Omega)/(2\ k\Omega+2\ k\Omega)=1\ k\Omega$ and $V_B=1\ k\Omega/(1\ k\Omega+2\ k\Omega)=1.0V$. The emitter voltage $V_E=1.0V-0.07V=0.3V$ and the collector current $I_C=0.3V/91\ \Omega=3.4$ mA. This is the current level for the lower power consumption mode and is sufficient to sustain oscillation. The current is reduced by more than 50% with a proportionate decrease in power consumption.

Although the present invention has been described with a certain degree of particularity, it is understood that the present disclosure has been made by way of example and that changes in details of structure may be made without departing from the spirit thereof.

What is claimed is:

1. An electronic oscillator including a tank circuit for producing oscillations, an amplifier circuit for sustaining said oscillations, and an output terminal, said amplifier circuit having an amplifying element with an input, an output and a control terminal, wherein the improvement comprises:

switching means, connected to said amplifier circuit, for switching said amplifier circuit between a normal power consumption mode and a lower power consumption mode by controlling said control terminal, with said amplifier circuit sustaining said oscillations in said tank circuit and providing a signal to said output terminal when in said lower power consumption mode and using less power when in said lower power consumption mode than when in said normal power consumption mode but still allowing the oscillator to function at a degraded performance level.

2. An electronic oscillator comprising:

a tank circuit for producing oscillations, an amplifier circuit connected to said tank circuit for sustaining oscillations, said amplifier circuit including an amplifying element with an input, an output and a control terminal, an output terminal, and switching means, connected to said amplifier circuit, for switching said amplifier circuit between a normal power consumption mode and a lower power consumption mode by controlling said control terminal, with said amplifier circuit sustaining oscillations and providing a signal to said output terminal when in said lower power consumption mode and using less power when in said lower power consumption mode than when in said normal power consumption mode but still allowing the oscillator to function at a degraded performance level.

3. The oscillator as set forth in claim 2 wherein said amplifier circuit includes a first resistor connected between said output and ground, and said switching means includes a second resistor connected between a DC voltage supply terminal and said control terminal, and selecting means, connected between said control terminal and ground, for selecting between a first resistance and a second resistance.

4. The oscillator as set forth in claim 3 wherein said amplifying element is a bipolar transistor, said input is a collector, said output is an emitter and said control terminal is a base.

5. The oscillator as set forth in claim 3 wherein said amplifying element is a field-effect transistor, said input is a drain, said output is an source and said control terminal is a gate.

6. The oscillator as set forth in claim 3 wherein said selecting means includes a third resistor, connected between said control terminal and ground, and a fourth resistor and a switching element connected in series between said control terminal and ground in parallel with said third resistor, said switching element being switchable off as an open to provide said first resistance as the resistance of said third resistor and said switching element being switchable on as a short to provide said second resistance as the parallel resistance of said third and fourth resistors.

7. The oscillator as set forth in claim 6 wherein said switching element is a field-effect transistor having a gate connected to a switching voltage terminal.

8. The oscillator as set forth in claim 6 wherein said switching element is a bipolar transistor having a base connected to a switching voltage terminal.

9. The oscillator as set forth in claim 6 wherein said switching element is a diode.

10. An electronic oscillator comprising:

a tank circuit for producing oscillations, an amplifier circuit connected to said tank circuit for sustaining oscillations, said amplifier circuit including a transistor having a base terminal, a collector terminal and an emitter terminal, and a first resistor connected between said emitter terminal and ground, and switching means, connected to said amplifier circuit, for switching said amplifier circuit between a normal power consumption mode and a lower power consumption mode with said amplifier circuit sustaining oscillations when in said lower power consumption mode and using less power when in said lower power consumption mode than when in said normal power consumption mode, said switching means including a second resistor connected between a DC voltage supply terminal and said base terminal of said transistor, a third resistor connected between said base terminal of said transistor and ground, a fourth resistor and a field-effect transistor having a gate, a source and a drain, said drain being connected to said base terminal of said transistor, said source being connected to said fourth resistor and said gate being connected to a switching voltage terminal, said fourth resistor being connected to ground opposite said source, so that the resistance between said base terminal and ground when said field-effect transistor is off is the value of said third resistor and the resistance between said base terminal and ground, when a voltage is applied to said switching voltage terminal to turn said field-effect transistor on, is the parallel resistance of said third and fourth resistors, whereby when said field-effect transistor is on the voltage at said base terminal is reduced, thereby reducing the voltage at said emitter terminal, thereby reducing the current through said first resistor, and thereby reducing the current through said collector terminal.

\* \* \* \* \*